United States Patent
Lee et al.

(10) Patent No.: US 6,617,656 B2
(45) Date of Patent: Sep. 9, 2003

(54) EDMOS DEVICE HAVING A LATTICE TYPE DRIFT REGION

(75) Inventors: Dae Woo Lee, Daejon-Shi (KR); Tae Moon Roh, Daejon-Shi (KR); Il Yong Park, Kyonggi-Do (KR); Yil Suk Yang, Daejon-Shi (KR); Jong Dae Kim, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/179,492

(22) Filed: Jun. 24, 2002

(65) Prior Publication Data

US 2003/0132459 A1 Jul. 17, 2003

(30) Foreign Application Priority Data

Jan. 17, 2002 (KR) ............................. 2002-2695

(51) Int. Cl.[7] .............................................. H01L 29/78
(52) U.S. Cl. ....................................... 257/401; 257/368
(58) Field of Search ................................. 257/368, 401

(56) References Cited

U.S. PATENT DOCUMENTS

| | | | |
|---|---|---|---|
| 6,198,141 B1 * | 3/2001 | Yamazaki et al. | ........... 257/404 |
| 6,207,994 B1 | 3/2001 | Rumennik et al. | |
| 6,512,268 B1 * | 1/2003 | Ueno | ........... 257/341 |
| 2001/0052601 A1 * | 12/2001 | Onishi et al. | ........... 257/138 |

FOREIGN PATENT DOCUMENTS

JP         2000252297 A  *  9/2000    ......... H01L/21/336

OTHER PUBLICATIONS

High Performance Stacked LDD RF LDMOSFET by Jun Cai et al. Proceedings of 2001 International Sym. on Power Semi. Devices & ICs, Osaka.
120 V Interdigitated–Drain LDMOS (IDLDMOS) on SOI Substrate Breaking Power LDMOS Limit by Shuming Xu et al. IEEE Transactions on Electron Devices, vol. 47, No. 10, Oct. 2000.

* cited by examiner

*Primary Examiner*—Allan R. Wilson
(74) *Attorney, Agent, or Firm*—Blakely, Sokoloff, Taylor & Zafman

(57) ABSTRACT

The present invention provides an EDMOS (extended drain MOS) device having a lattice type drift region and a method of manufacturing the same. In the case of n channel EDMOS (nEDMOS), the drift region has a lattice structure in which an n lattice having a high concentration and a p lattice having a low concentration are alternately arranged. As a drain voltage is applied, a depletion layer is abruptly extended by a pn junction of the n lattice and the p lattice, so that the entire drift region is easily depleted. Therefore, a breakdown voltage of the device is increased, and an on resistance of the device is decreased due to the n lattice with high concentration.

4 Claims, 8 Drawing Sheets

EDMOS DEVICE HAVING A LATTICE TYPE DRIFT REGION

BACKGROUND OF THE INVENTION

1. Field of the Invention

The present invention relates generally to an EDMOS (extended drain MOS) having a lattice type drift region and a method of manufacturing the same. More particularly, the invention relates to an EDMOS having a lattice type drift region and a method of manufacturing the same in which a lattice of an n type impurity (hereinafter, called 'n lattice') having a high concentration and a lattice of a p type impurity (hereinafter, called 'p lattice') having a low concentration form a drift region and a pn junction to have a high breakdown voltage and a low on resistance.

2. Description of the Prior Art

FIG. 1 is a perspective view of a conventional nEDMOS device.

Referring now to FIG. 1, a p well region 104 is formed in a given region of a p type silicon substrate 101. An n-drift region 107 as an extended drain region is then formed in a given region of the p well region 104. Field oxide films 109 and 109a are formed on a given region of the p type silicon substrate 101. An n+ source region 112 and a p+ source contact region 114 are adjacently formed on another given regions of the p well region 104. Thereafter, an n+ drain region 113 is formed in a given region of the n– drift region 107. A polysilicon gate electrode 111 in which the gate oxide film 110 is intervened is formed on a given region of the p type silicon substrate 101. At this time, the n– drift region 107 is extended from an edge of the polysilicon gate electrode 111 to the bottom of n+ drain region 113. Further, a source electrode 116 connected to the n+ source region 112 and the p+source contact region 114, and a drain electrode 117 connected to the n+ drain region 113 are formed on an insulating layer 115.

In the conventional nEDMOS constructed above, the n– drift region 107 is composed of a single layer doped an n type impurity. The breakdown voltage and the on resistance of the device are determined by the concentration of an n type impurity, the depth and length of the drift region, and the like. In other words, if the concentration of an n type impurity in the n– drift region 107 is increased, the on resistance is lowered but the breakdown voltage of the device is lowered. On the contrary, if the concentration of an n type impurity in the n– drift region 107 is reduced, the breakdown voltage of the device is increased and the on resistance is also increased.

As such, in order to increase the concentration of an impurity in the n drift region 107 of the conventional nEDMOS device, there are many limits in the structure and manufacturing process of the device. Therefore, it is difficult to realize a device simultaneously having a high breakdown voltage and a low on resistance.

SUMMARY OF THE INVENTION

The present invention is contrived to solve the above problems and an object of the present invention is to provide an EDMOS device and a method of manufacturing the same capable of simultaneously obtaining a high breakdown voltage and a low on resistance.

Another object of the present invention is to provide an EDMOS device having a lattice type drift region and a method of manufacturing the same capable of simultaneously obtaining a high breakdown voltage and a low on resistance, in such a way that an n lattice having a high concentration and a p lattice having a low concentration form a pn junction.

The present invention can improve the breakdown voltage and the on resistance characteristics of the nEDMOS device by forming a drift region composed of an n lattice and p lattice. In the nEDMOS device proposed by the present invention, an impurity concentration of the n lattice is much higher than that of an n– drift region of the conventional device, and an impurity concentration of the p lattice is similar to that of the p well. Therefore, as the n lattice having a high concentration and the p lattice having a low concentration are adjacently and alternately formed to a pn junction, the depletion layer is rapidly extended by applying a drain voltage. Therefore, according to the present invention, the breakdown voltage of the nEDMOS device become higher and the on resistance of the nEDMOS device become lower than those of the conventional nEDMOS device due to a high impurity concentration of the n lattice.

Further, the nEDMOS device having the drift region of a lattice structure according to the present invention has an advantage that it can be manufactured together with a conventional CMOS device. Therefore, an optimum of the process and device structure is necessary to easily form a depletion layer between a pn junction while increasing the concentration of the n lattice. The optimum is accomplished by controlling the impurity concentration, size and depth of the n lattice and the p lattice, and the distance between the n lattice and the p lattice.

In order to accomplish the above object, an EDMOS device having a lattice type drift region according to the present invention, is characterized in that it comprises a well region formed in a given region of a silicon substrate; a lattice type drift region formed in a given region of the well region and composed of a first lattice and a second lattice alternately arranged; a field oxide film formed on the silicon substrate and overlapped with a portion of the well region or a portion of the well region and the drift region; a drain region formed in a given region of the drift region; a diffusion region formed below the drain region; a source region and a source contact region formed in the well region; a gate electrode formed on the silicon substrate of the well region, wherein a gate insulating film is intervened between the gate electrode and the silicon substrate; a source electrode connected to the source region and the source contact region via a contact hole formed in an insulating film; and a drain electrode connected to the drain region via a contact hole formed in the insulating film.

Further, a method of manufacturing an EDMOS device having a lattice type drift region is characterized in that it comprises the steps of forming a well region in a given region of a silicon substrate; alternately implanting first impurity ions in a given region of the well region to form a lattice type drift region having a first lattice and a second lattice which are alternately arranged, wherein the first lattice is implanted by the first impurity ions; forming a field oxide film on a given region of the silicon substrate; implanting second impurity ions in the well region to control a threshold voltage; forming a gate insulating film and a polysilicon film on the silicon substrate of the well region, and then patterning the polysilicon film to form a gate electrode; implanting third impurity ions in the well region and the drift region to form a source region and a drain region, respectively; implanting fourth impurity ions in the well region to form a source contact region connected to the source region; forming an insulating film on an entire structure, and then forming contact holes in the insulating film to expose the source region, the drain region and the gate electrode; and forming metal wires connected to the source region, the drain region and the gate electrode via the contact holes, respectively.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
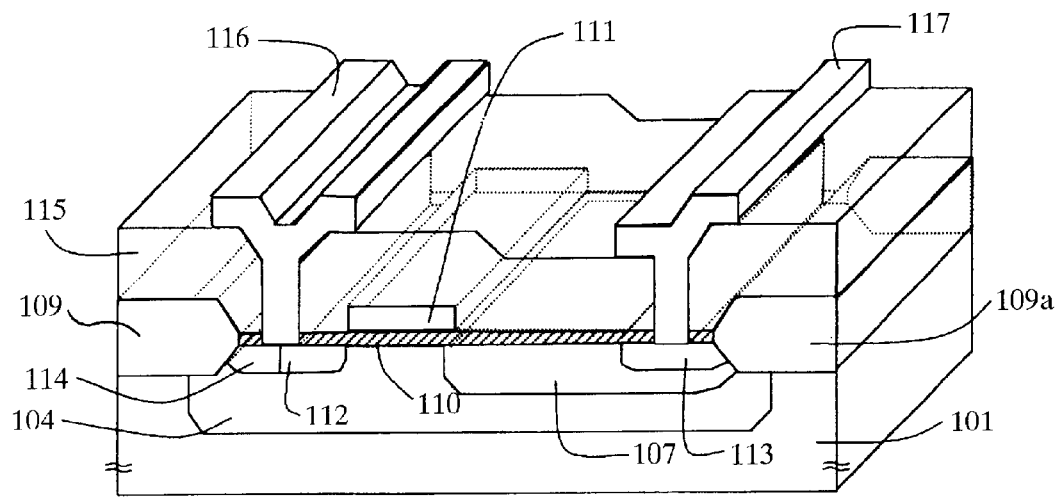
FIG. 1 is a perspective view of a conventional EDMOS device.

The present invention will be described in detail by way of a preferred embodiment with reference to accompanying drawings, in which the reference numerals are used to identify the same or similar parts.

Figure 2:
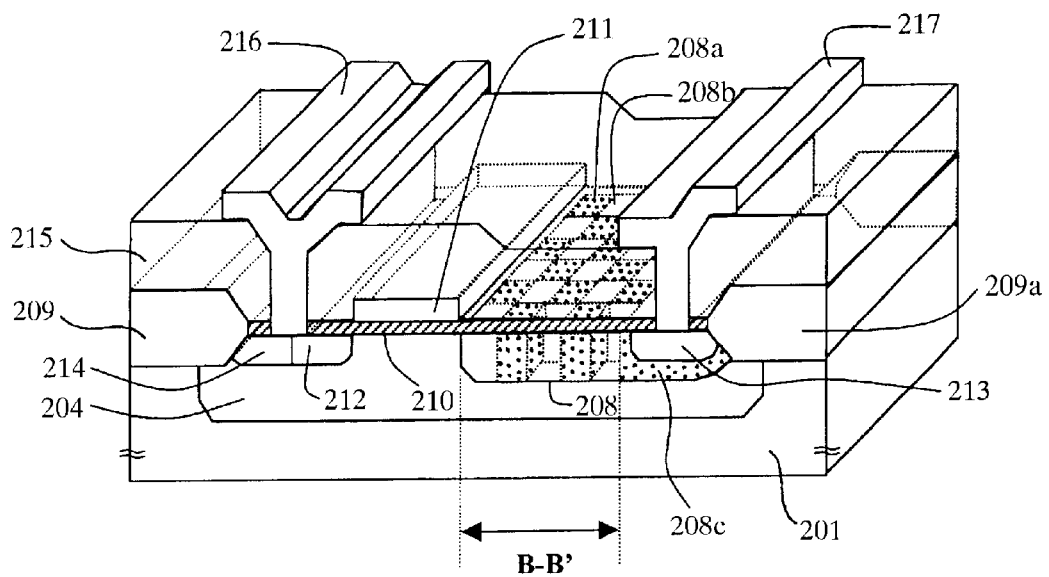
FIG. 2 is a perspective view of an EDMOS device according to the present invention.

FIG. 2 is a perspective view of an EDMOS device having a lattice type drift region according to the present invention.

A well region 204 of a first conductive type is formed in a given region of a silicon substrate 201. A drift region 208 of a second conductive type having a lattice structure is formed in a given region of the well region 204. Field oxide films 209 and 209a are formed at given regions on the silicon substrate 201. At this time, the field oxide films 209 and 209a are formed to overlap with a portion of the well region 204 or a portion of the well region 204 and the drift region 208. The drift region 208 includes an n lattice 208a and a p lattice 208b that is connected to the well region 204 and has the same concentration of the well region 204 having a low concentration. A drain region 213 is formed in a given region within the drift region 208. An n drift region 208c having the same concentration to the n lattice 208a is formed below the drain region 213. A source region 212 and a source contact region 214 are formed in another given regions of the well region 204. A polysilicon gate electrode 211 in which a gate insulating film 210 is intervened is formed at a given region on the well region 204. A source electrode 216 connected to the source region 212 and the source contact region 214 and a drain electrode 217 connected to the drain region 213 are formed on an insulating film 215.

Figure 3A:
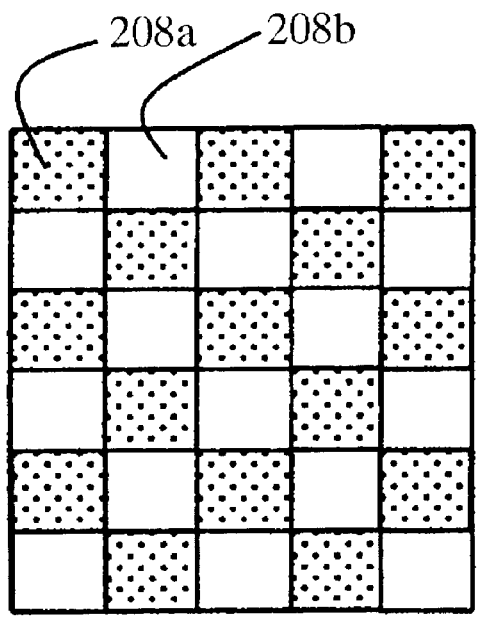
FIG. 3a~FIG. 3c show several lattice structures of a drift region of the EDMOS device according to the present invention.
Figure 3B:
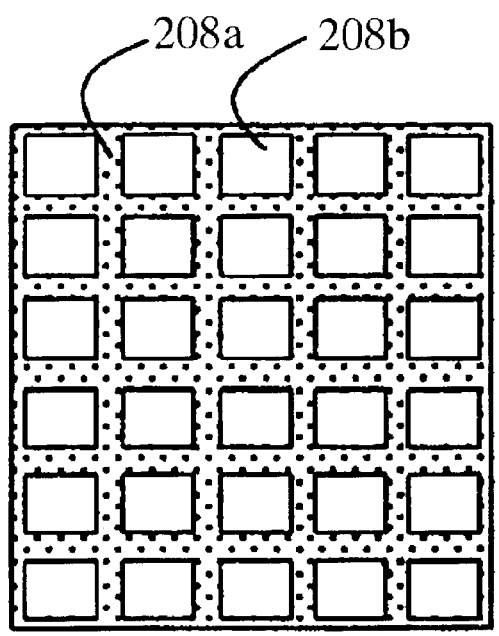
Figure 3C:
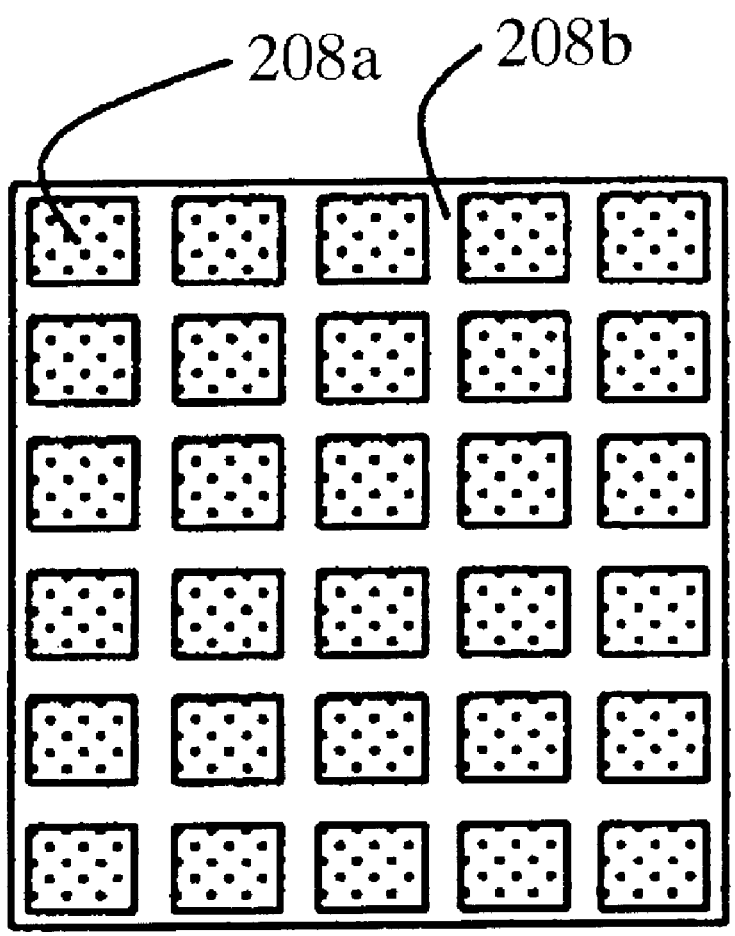

FIG. 3a~FIG. 3c illustrate the lattice structures of a drift region taken along lines B–B' in FIG. 2. In drift region of an nEDMOS device according to the present invention, the n lattice 208a of a high concentration and the p lattice 208b of a relatively low concentration are sequentially repeated to form a pn junction.

Figure 4A:
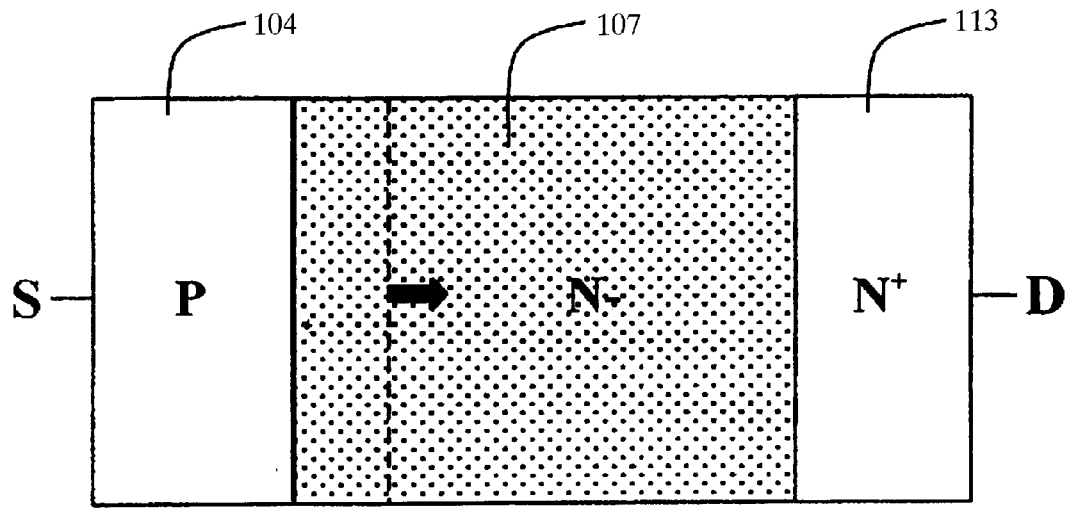
FIG. 4a and FIG. 4b are drawings for describing processes by which a depletion layer is formed when a conventional nEDMOS device and an nEDMOS device of the present invention are driven.
Figure 4B:
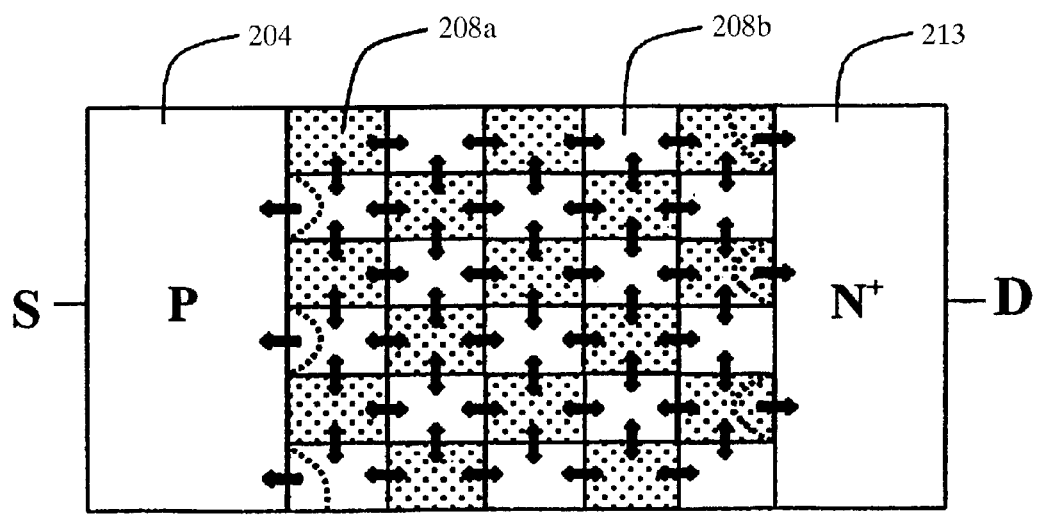

FIG. 4a and FIG. 4b are drawings for describing processes by which a depletion layer is formed when a conventional nEDMOS device and an nEDMOS device of the present invention are driven.

In case of the conventional nEDMOS device shown in FIG. 4a, a depletion layer in an n– drift region 107 is generated to a drain region side 113 (hereinafter, called drain side) by applying the drain voltage. At this time, the depletion layer is formed in a portion of the n– drift region 107 as the impurity concentration in the n– drift region 107 is higher. As a result, the breakdown voltage is lowered due to a high electric field between the well and the drift region 107.

On the contrary, in case of the nEDMOS device of the present invention in FIG. 4b, a depletion layer is extended to both directions that is, lateral and transverse directions of the drain region 213 due to a pn junction of the n lattice and the p lattice by applying the drain voltage, the entire drift region is depleted, thereby. Therefore, the breakdown voltage of the nEDMOS device become higher due to a rapid depletion and the on resistance of the nEDMOS device become lower due to a high impurity concentration of the n lattice.

Referring now to FIG. 2, FIG. 3a~FIG. 3c, and FIG. 4a and FIG. 4b, characters of the nEDMOS device having a lattice structure according to the present invention will be described below.

In FIG. 2, in case of the nEDMOS device, the n lattice 208a in the drift region 208 and the p lattice 208b extended to the p well region 204 are alternately arranged in all directions while forming the pn junction together. The concentration of the n lattice 208a is higher than that of the p lattice 208b. Therefore, when the drain voltage is applied, the p lattice 208b is rapidly depleted from adjacent n lattice 208a and the n lattice 208a is rapidly depleted from adjacent p lattice 208b, as shown in FIG. 4b. As a result, as the entire drift region 208 is depleted, the breakdown voltage is increased. At the same time, as the gate voltage is applied, the on resistance is lowered due to the n lattice of a high impurity concentration. Further, n and p lattice structures presented in FIG. 3aFIG. 3c are used in the nEDMOS device of the present invention since it increases the breakdown voltage and lowers the on resistance, as shown in FIG. 2. The basic principle by which the depletion layer is formed is same.

FIG. 5a~FIG. 5h are cross-sectional views for describing a method of manufacturing the nEDMOS device having a lattice type drift region according to the present invention.

Figure 5A:
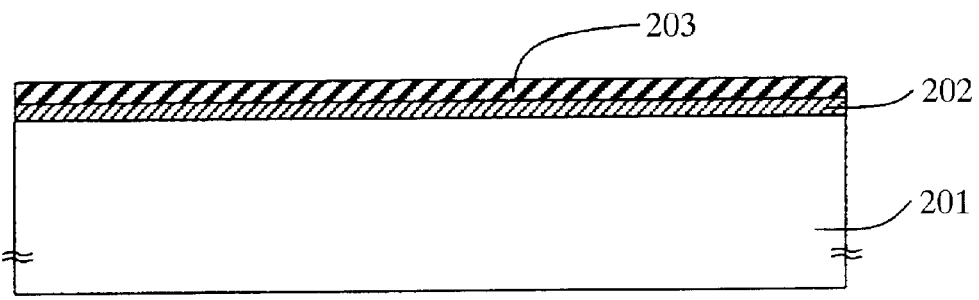
FIG. 5a~FIG. 5h are cross-sectional views for describing a method of manufacturing an EDMOS device of the present invention.

Referring now to FIG. 5a, an oxide film 202 having a thickness of 300 ~400 Å is grown on a p type silicon substrate 201. A nitride film 203 having a thickness of 1000 ~1200 Å is then deposited on the oxide film 202 by means of a low pressure chemical vapor deposition (LPCVD) method.

Figure 5B:
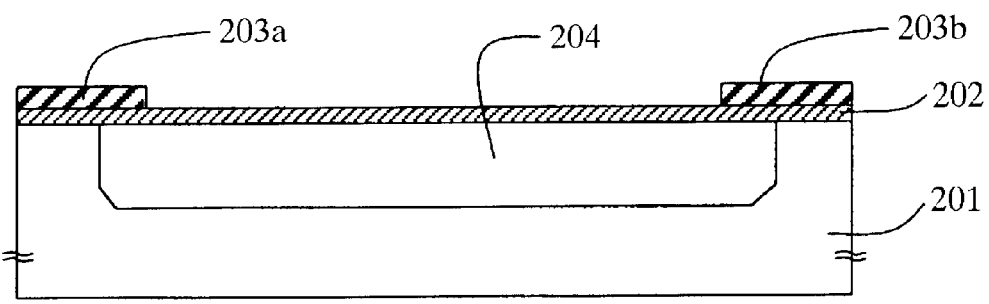

Referring now to FIG. 5b, a photoresist film (not shown) is formed on the nitride film 203, and then defined by a photolithography process using a mask for a p well region. Next, the nitride film 203 exposed is etched, nitride films 203a and 203b remain at both edges of the p well region, thereby. Boron ions are implanted to the silicon substrate 201 at the dose of about $1.0 \sim 2.0 \times 10^{13}$ cm$^{-2}$, the photoresist film is removed and an annealing process is then performed at the temperature of 1150° C. under N$_2$ atmosphere, thus forming the p well region 204.

Figure 5C:
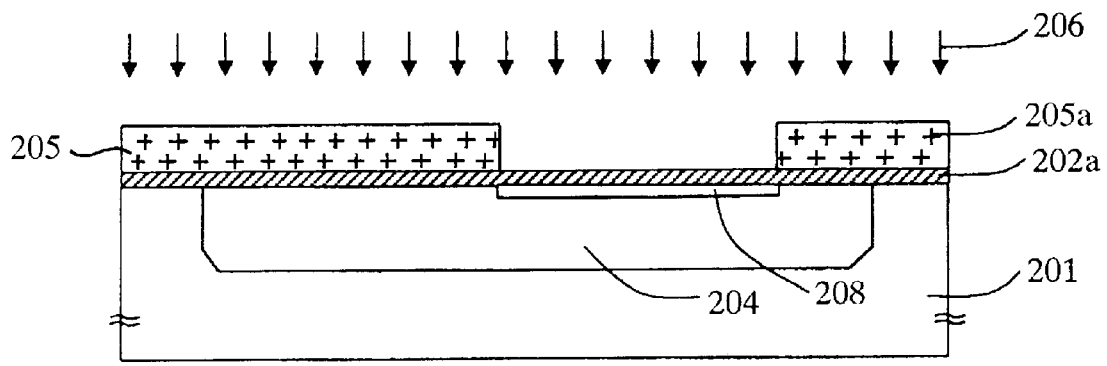

By reference to FIG. 5c, the nitride films 203a and 203b and the oxide film 202 are sequentially removed by a wet etch method. An oxide film 202a is grown in a thickness of 300~400 Å on the silicon substrate 201. A photoresist film is formed on the oxide film 202a. Photoresist patterns 205 and 205a are formed on the oxide film 202a by a photolithography process using a mask for a drift region having a lattice structure. A drift region 208 having an n lattice 208a is then formed by the injection of phosphorous (P) ions. At this time, the masks having the structures as shown in FIG.

3a–FIG. 3c may be used to form the drift region 208 having the n lattice 208a.

Figure 5D:
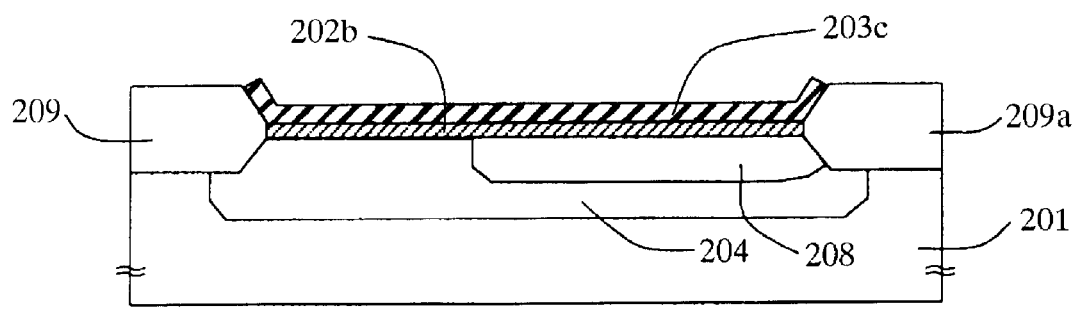

Referring now to FIG. 5d, the photoresist patterns 205 and 205a, and the oxide film 202a are removed. An oxide film 202b is grown on the silicon substrate 201 in a thickness of 300~400 Å. Next, a nitride film having a thickness of 1400~1600 Å is deposited on the oxide film 202b. In order to define an active region in the device, the photoresist pattern (not shown) is formed on the nitride film to define an active region.

Next, the nitride film exposed is etched by a dry etch process, thereby the nitride film 203c is remained on the active region. Thereafter, the photoresist pattern is removed, and then field oxide films 209 and 209a are grown in a thickness of 6000~7000 Å, thus a drift region 208 within the p well region 204 is formed.

Figure 5E:
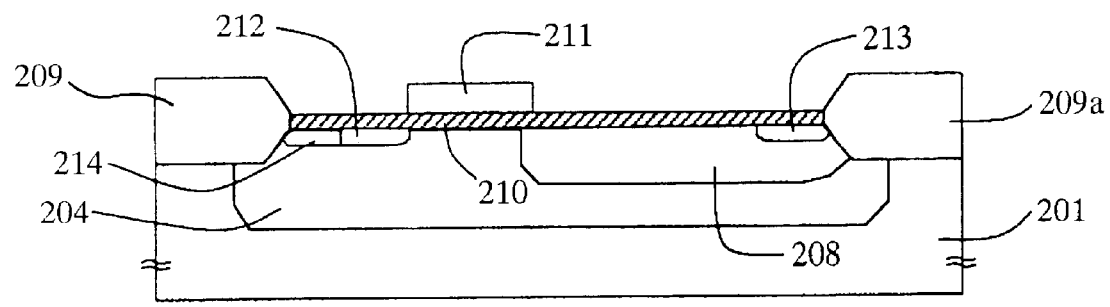

Referring now to FIG. 5e, after the nitride film 203c is removed by a wet etching process, the oxide film 202b is removed. An oxide film (not shown) is then grown on the silicon substrate 201 in a thickness of about 200~300 Å. Boron (B) ions are implanted to the silicon substrate 201 to control the threshold voltage of the device. Next, after the oxide film (not shown) is removed, a gate oxide film 210 is grown on the silicon substrate 201. A polysilicon film is deposited on the gate oxide film 210, and then $POCl_3$ ions are doped in the polysilicon film. A polysilicon gate electrode 211 is formed by a photolithography process using a mask for gate electrode.

Thereafter, an oxide film (not shown) having a thickness of 100~200 Å is grown on the entire structure. A photoresist pattern (not shown) is formed on the oxide film to define the source and drain regions. Then, arsenic (As) ions are implanted to form a source region 212 and a drain region 213. The photoresist pattern is removed, and a boron (B) ion implantation process using a p+ mask is performed to form a p+ source contact region 214.

Figure 5F:
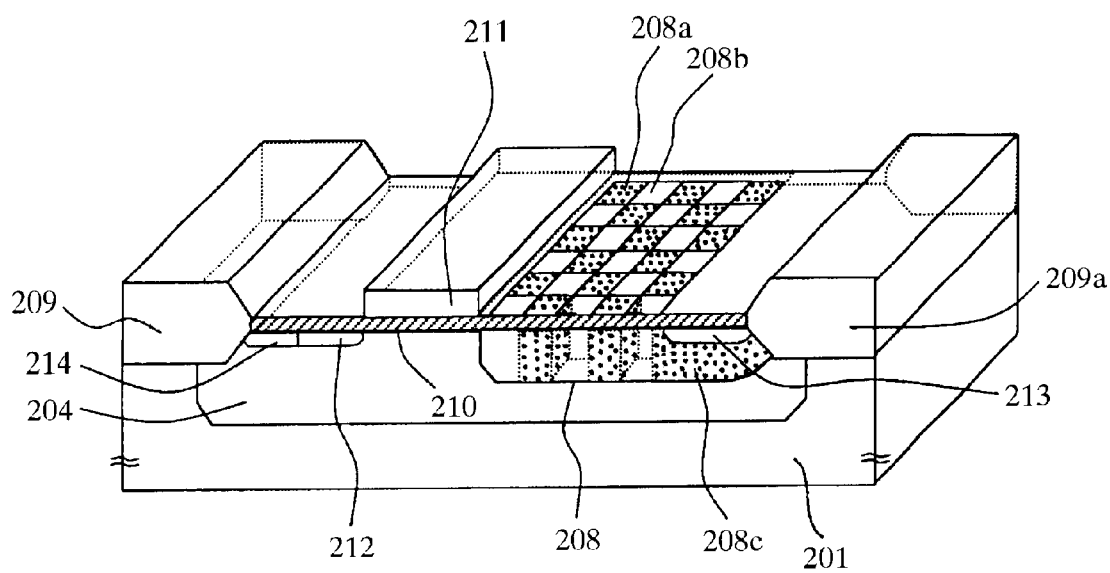

FIG. 5f illustrates a three-dimensional drawing of FIG. 5e, in which the n lattice 208a and the p lattice 208b are arranged within the drift region 208. The concentration of the n lattice 208a is relatively higher than that of the p lattice 208b. At this time, the p lattice 208b connected to the p well 204 has the same concentration with the p well 204. The p lattice 208b is automatically self-aligned in a process of forming the n lattice 208a without an additional mask. If it is desired to increase or control the concentration of the p lattice 208b, however, a mask for the p lattice may be selectively used. Further, an n drift region 208c having the same concentration with the n lattice 208a is formed below the n+ drain region 213. At this time, the mask used in a process for forming the n lattice is used.

Figure 5G:
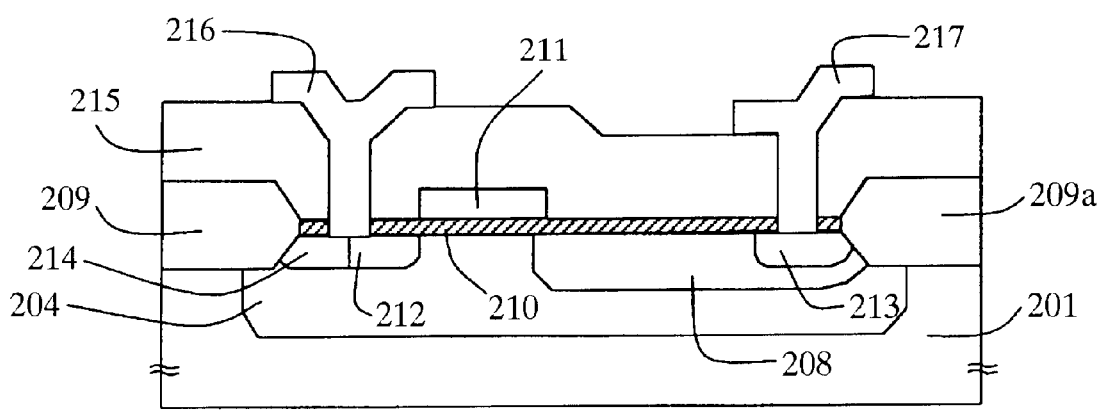

Referring now to FIG. 5g, an interlayer insulating film 215 in a thickness of about 6000 Å is deposited on the polysilicon gate electrode 211 at a low temperature. A TEOS oxide film having a thickness of about 1500 Å and a BPSG (boron phosphorus silicate glass) film having a thickness of about 4500 Å are used as the interlayer insulating film 215. Next, an annealing process is performed at the temperature of 900° C.

Figure 5H:
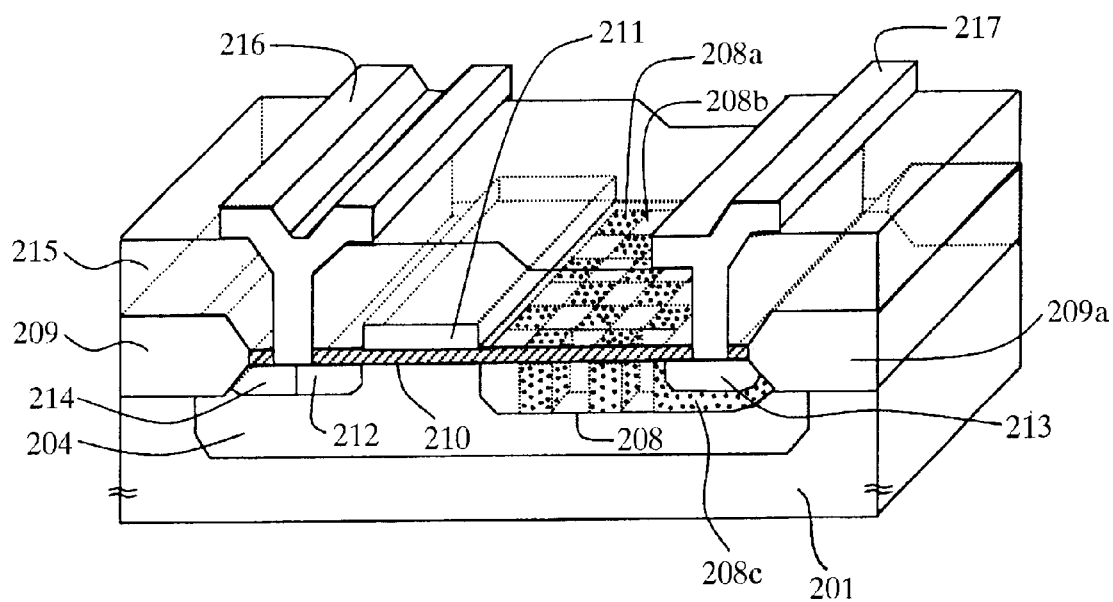

A photoresist film (not shown) is formed on the interlayer insulating film 215, and then patterned by a photolithography process using a contact mask. Exposed portions of the interlayer insulating film 215 are removed by a dry etching process. Thereby, contact holes through which the n+ source region 212, the n+ drain region 213 and the p+ source contact region 214 are exposed are formed. A metal layer is formed on the entire structure so that the contact hole can be buried. Thereafter, the metal layer is patterned by photolithography and etching process to form a source electrode 216, a drain electrode 217 and a gate electrode (not shown) and an annealing process is then performed. Thus, as shown in FIG. 5h, a high voltage nEDMOS device having a drift region 208 in which the n lattice 208a and the p lattice 208b are alternately arranged can be obtained.

As mentioned above, according to the present invention, as a p lattice of a low concentration and an n lattice of a high concentration adjacent to the p lattice form a pn junction, a high breakdown voltage and a low on resistance can be obtained at the same time. Therefore, the EDMOS device having a drift region of a lattice structure presented by the present invention can be widely applied to power IC devices such as middle and high voltage power devices. In particular, the present invention can be applied to the semiconductor power IC devices requiring high voltage, high speed and high performances, IC devices for controlling the power of the automobile and motor, IC devices for driving a display device and communication device, and the like.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. An EDMOS device having a lattice type drift region, comprising:

a well region formed in a given region of a silicon substrate;

a lattice type drift region formed in a given region of said well region and composed of a first lattice and a second lattice alternately arranged;

a field oxide film formed on said silicon substrate and overlapped with a portion of said well region or a portion of said well region and said drift region;

a drain region formed within a given region of said drift region;

a diffusion region formed below said drain region;

a source region and a source contact region formed in said well region;

a gate electrode formed on said silicon substrate of said well region, wherein a gate insulating film is intervened between said gate electrode and said silicon substrate;

a source electrode connected to said source region and said source contact region via a contact hole formed in an insulating film; and a drain electrode connected to said drain region via a contact hole formed in said insulating film.

2. The EDMOS device as claimed in claim 1, wherein a concentration of said first lattice is higher than that of said second lattice, and said first lattice and said second lattice are alternately arranged in all directions.

3. The EDMOS device as claimed in claim 1, wherein said second lattice has the same concentration with said well region.

4. The EDMOS device as claimed in claim 1, wherein said second lattice has a concentration different from said well region.

* * * * *